United States Patent [19]
Glavish

[11] Patent Number: 5,504,341
[45] Date of Patent: Apr. 2, 1996

[54] PRODUCING RF ELECTRIC FIELDS SUITABLE FOR ACCELERATING ATOMIC AND MOLECULAR IONS IN AN ION IMPLANTATION SYSTEM

[75] Inventor: Hilton F. Glavish, Incline Village, Nev.

[73] Assignee: Zimec Consulting, Inc., Incline Village, Nev.

[21] Appl. No.: 390,765

[22] Filed: Feb. 17, 1995

[51] Int. Cl.⁶ .................................................. H01J 37/317
[52] U.S. Cl. .................................... 250/492.21; 315/5.41; 315/505
[58] Field of Search ..................... 250/492.21; 315/505, 315/5.41

[56] References Cited

U.S. PATENT DOCUMENTS

| | | | |
|---|---|---|---|
| 3,958,883 | 5/1976 | Turner | 356/85 |
| 4,058,742 | 11/1977 | O'Brien | 307/260 |
| 4,140,942 | 2/1979 | Auslender et al. | 315/5.41 |
| 4,197,510 | 4/1980 | Szu | 328/234 |
| 4,245,179 | 1/1981 | Buhrer | 315/248 |
| 4,306,175 | 12/1981 | Schleicher et al. | 315/111.21 |
| 4,383,180 | 5/1983 | Turner | 250/492.21 |
| 4,439,733 | 3/1984 | Hinshaw et al. | 324/322 |
| 4,485,346 | 11/1984 | Swenson et al. | 315/505 |
| 4,504,788 | 3/1985 | Froncisz et al. | 324/316 |
| 4,667,111 | 5/1987 | Glavish et al. | 250/492.2 |
| 4,782,304 | 11/1988 | Aitken | 250/492.21 |
| 4,801,847 | 1/1989 | Sakudo et al. | 315/5.41 |
| 4,866,344 | 9/1989 | Ross et al. | 315/3.5 |
| 4,910,439 | 3/1990 | El-Hamamsy et al. | 315/248 |
| 5,055,853 | 10/1991 | Garnier | 343/769 |
| 5,086,256 | 2/1992 | Tokiguchi et al. | 315/111.81 |
| 5,130,552 | 7/1992 | Bright et al. | 250/492.2 |
| 5,132,545 | 7/1992 | Shono et al. | 250/492.2 |
| 5,241,245 | 8/1993 | Barnes et al. | 315/111.41 |
| 5,277,751 | 1/1994 | Ogle | 156/643 |
| 5,349,196 | 9/1994 | Amemiya et al. | 250/492.21 |

FOREIGN PATENT DOCUMENTS

61-140049  6/1986  Japan .

OTHER PUBLICATIONS

H. F. Glavish, "Radio–Frequency Linear Accelerators for Commercial Ion Implanters", Nuclear Instruments and Methods in Physics Research, B24/25 (1987), pp. 771–775.
H. F. Glavish, "Radio–Frequency Linear Accelerators for Ion Implanters", Nuclear Instruments and Methods in Physics Research, B21 (1987), pp. 218–223.
Glavish et al., "Production High Energy Ion Implanters Using Radio Frequency Acceleration", Nuclear Instruments and Methods in Physics Research, B21 (1987), pp. 264–269.

*Primary Examiner*—Jack I. Berman
*Attorney, Agent, or Firm*—Fish & Richardson

[57] ABSTRACT

An ion beam accelerator and an ion implantation system including a plurality of spaced apart electrodes, including at least one active electrode, and a pair of oppositely wound coils disposed within the shield, the coils being in parallel, having respective terminating ends electrically coupled together in pairs, the end regions of the two coils being positioned relative to each other for flow of flux between the coils so that, when the coils are energized, magnetic fields produced by the coils are reinforced within the coils and are reduced outside of the coils; wherein, when the coils are energized, the coils produce at the active electrode a time-varying oscillatory electric potential of a selected resonant frequency to establish between electrodes a time-varying oscillatory electric field in the vicinity of the beam path to accelerate ions. A general purpose resonant system based on the above-mentioned oppositely wound coil structure is also disclosed.

19 Claims, 10 Drawing Sheets

| Parameter | Value | Parameter | Value |
|---|---|---|---|
| Coil dia. (mm) | 150 | Number of turns | 12 |
| Torus mean dia. (mm) | 280 | Circuit inductance L (µH) | 4.99 |
| Shield dia. (mm) | 600 | Circuit capacitance C (pF) | 27.62 |
| Shield length (mm) | 370 | Circuit resistance R (ohms) | 0.105 |
| Active electrode length (mm) | 40 | Resonant frequency (MHz) | 13.56 |
| Active electrode dia. (mm) | 60 | Quality factor Q | 4045 |
| Electrode gap (mm) | 18.5 | Peak current (A) | 244 |
| Stem diameter (mm) | 25 | Peak voltage (V) | 95 |
| Stem length (mm) | 200 | Power (W) | 2624 |
| Winding conductor dia. (mm) | 16 | | |

FIG. 9

PRODUCING RF ELECTRIC FIELDS SUITABLE FOR ACCELERATING ATOMIC AND MOLECULAR IONS IN AN ION IMPLANTATION SYSTEM

BACKGROUND OF THE INVENTION

The invention relates to a system and method for producing radio-frequency electric fields suitable for accelerating atomic and molecular ions in an ion implantation system.

The use of beams for treating and irradiating a workpiece in general and semiconductor wafers in particular is known in the prior art. Charged particles (e.g., ions of atomic and molecular species) are often accelerated to high velocities before impinging on the workpiece. In the case of ion implantation, the final energy level of the accelerated ions is controlled in order to achieve a desired depth of implantation and substrate characteristic.

In one type of accelerator, an ion beam is accelerated by a static electric field. The final ion energy is controlled by adjusting the strength of the electric field and by adjusting the distance over which the electric field accelerates the ions. In another type of static electric field accelerator, negatively charged ions are accelerated from ground potential to a high positive potential and then stripped of their electronic charge to form positive ions that are finally accelerated back to ground potential.

Recently, an ion accelerator has been developed that produces ion-accelerating electric fields that vary periodically with time at a specified rf frequency. This system is described in U.S. Pat. No. 4,667,111 to H. F. Glavish et al., which is herein incorporated by reference. According to this scheme, an accelerator is constructed from multiple acceleration stages, with each stage including an rf resonant circuit that has an accelerating electrode disposed between two grounded electrodes that are respectively spaced apart from the accelerating electrode to define accelerating gaps therebetween. A beam of ions enters the accelerator with a low initial velocity and the ions are subsequently accelerated to energies on the order of 1 MeV per charge state. Synchronous acceleration of ions results when the phase and amplitude of the rf voltage applied to each electrode is selected appropriately for the specified frequency, the geometry of the electrodes, the initial ion energy, the final desired ion energy, and the charge-to-mass ratio of the accelerated ion species. For further description of such an ion acceleration scheme see H. F. Glavish, "Radio-frequency linear accelerators for ion implanters", *Nucl Instr. & Methods*, vol B21 1987, pp. 218–223, and H. F. Glavish, "Radio-frequency linear accelerators for commercial ion implanters", *Nucl. Instr. & Methods*, vol. B24/25 1987, pp. 771–775, which are herein incorporated by reference.

SUMMARY OF THE INVENTION

In a general aspect, the invention features an apparatus for accelerating atomic and molecular ions comprising: an ion input for receiving ions traveling along a beam path; an ion output positioned along the beam path to output accelerated ions; an electrically conductive shield; a pair of oppositely wound coils disposed within the shield, the coils, being in parallel, have respective terminating ends electrically coupled together in pairs, the end regions of the two coils being positioned relative to each other for flow of flux between the coils so that, when the coils are energized, magnetic fields produced by the coils are reinforced within the coils and are reduced outside of the coils; and a plurality of spaced apart electrodes that are positioned between the ion input and the ion output and that include at least one active electrode that is electrically coupled to the coils, wherein, when the coils are energized, the coils produce at the active electrode a time-varying oscillatory electric potential of a selected resonant frequency to establish between electrodes a time-varying oscillatory electric field in the vicinity of the beam path to accelerate the ions received by the ion input.

In another general aspect, the invention features an apparatus for implanting atomic and molecular ions into a workpiece comprising: an ion source for directing ions along a beam path; at least one resonating ion accelerating stage, as defined above, for accelerating ions from the ion source; and a support for positioning the workpiece so that accelerated ions from the output of the ion accelerator impact the surface of the workpiece and become implanted therein.

Embodiments of the invention may include one or more of the following features. The end regions of the oppositely wound coils are generally aligned with each other to mutually provide respective magnetic paths for return flux generated by the coils. The oppositely wound coils define a substantially continuous, substantially unidirectional path for magnetic flux generated by the coils. The oppositely wound coils are constructed and arranged so that magnetic fields generated by the coils are substantially confined within a domain defined by the windings of the coils. The oppositely wound coils preferably define a generally toroidal surface having a generally circular inner boundary region and a generally circular outer boundary region. The coils are respectively formed so that the ratio of the inter-turn spacing to the circumference at the inner boundary region of the toroidal surface is substantially the same as the corresponding ratio at the outer boundary region of the toroidal surface. The toroidal surface lies in a plane substantially perpendicular to the beam path of the ions. Three coaxially aligned electrodes preferably define an acceleration path. One of these three electrodes is an active electrode that is coupled to the resonator and is positioned in the ion beam path between two electrodes that are coupled to ground potential and are spaced apart from the active electrode to respectively define first and second accelerating gaps therebetween.

In a preferred ion implantation system, a plurality of successive resonating accelerator stages are respectively coupled to different respective active electrodes, between which are disposed electrodes coupled to ground potential. The successive accelerator stages preferably have respective resonant frequencies that are adjustable in phase and amplitude to tune the alternate active electrodes for accelerating a selected ion species so that, when energized by the accelerator stages, the active electrodes create a time-varying electric field to accelerate ions successively through a plurality of accelerating gaps defined between active and grounded electrodes. The time-varying fields produced by the accelerator stages at the active electrodes are preferably characterized by peak amplitudes between 10 kV and 200 kV and frequencies between 5 MHz and 50 MHz.

The ions are preferably accelerated through a plurality of successive spaced apart acceleration stages. The phases of the time-varying electric fields between the acceleration stages are preferably coordinated based upon the charge-to-mass ratio of the ions to achieve a desired energy for the implanted ions.

The invention also features a general purpose resonant system based on the above-mentioned oppositely wound coil structure for producing a time-varying electric potential of a selected resonant frequency.

Preferred resonant systems may include one or more of the following features. The oppositely wound coils define a generally toroidal surface having a generally circular inner boundary region and a generally circular outer boundary region. The coils are respectively formed from elongated conductive material having a width that is greater at locations corresponding to the inner boundary region of the toroidal surface that at locations corresponding to the outer boundary region of the toroidal surface. The coils are formed from elongated conductive material having a thickness dimension selected to substantially reduce the rf resistance of the coils. The conductive shield has a generally cylindrical shape. A movable conductive surface is preferably provided for adjusting the resonant frequency of the supplied time-varying electric field. In certain preferred embodiments, the input is coupled to the conductive shield and the output is electrically insulated from the conductive walls of the shield.

Among the advantages of the invention are the following. The utility of rf accelerators in ion implantation, particularly for high energies, is limited by the power that is required to generate the rf electrode voltages required to accelerate ions within an accelerator of practical size. The invention provides a commercially viable high energy rf ion implantation system that is of relatively low-cost, low power, and physically compact. The features of a high quality factor and low power loss achievable by the claimed resonator extends its usefulness to applications outside of the field of ion implantation (e.g., in rf amplifiers, in impedance transformers, and in coupling networks).

Other features and advantages will become apparent from the following description and from the claims.

BRIEF DESCRIPTION OF THE DRAWINGS

FIG. 8b is an enlarged view of a region of the successive accelerator stages shown in FIG. 8a.

FIG. 9 is a table of specifications for a presently preferred ion implanter.

DESCRIPTION OF THE PREFERRED EMBODIMENTS

Figure 1:
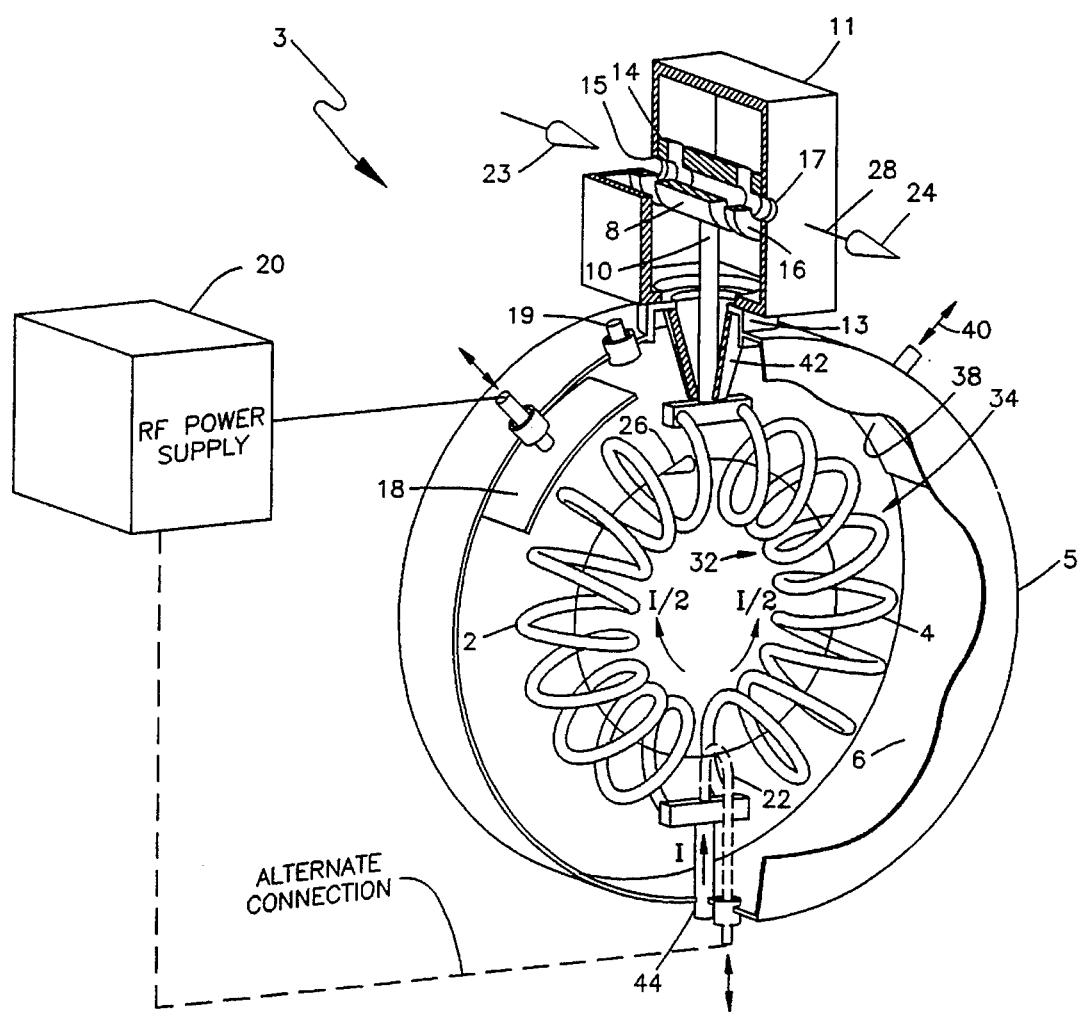
FIG. 1 is a perspective view, in partial cross section, of an apparatus for accelerating ions.

Referring to FIG. 1, an apparatus for accelerating ions (e.g., atomic and molecular ions) includes a radio-frequency (rf) electromagnetic resonator 3 that has a coil shield 5 containing a pair of parallel connected oppositely wound helical coils 2, 4. Coil shield 5 is connected by a flange 13 to an electrode housing 11 that contains three spaced-apart coaxial electrodes 14, 8, and 16. The three electrodes are each generally cylindrical in shape and possess a generally cylindrical bore; together the electrodes define an acceleration path for an input ion beam 23 between an input aperture 15 and an output aperture 17 of the electrode housing. Center electrode 8 is connected to the high voltage end of coils 2, 4 by a stem 10; the other two electrodes are held at ground potential by electrical connection to an inner wall of electrode housing 11. To minimize power losses, the electrode surfaces, the inner wall surfaces of the electrode housing and the coil shield, the stem, and the surfaces of the coils are formed from non-ferromagnetic material of high electrical conductivity (e.g., aluminum or copper).

To maintain accurate mechanical alignment of active electrode 8 relative to ground electrodes 14, 16, the stem 10 is rigidly connected to a high purity, low loss dielectric insulator 42. In one embodiment, this insulator may take the form of a sealed bushing, as shown, so that high vacuum conditions can be maintained on the electrode side of the bushing as required for ion beam transport. On the coil side of the bushing, the coil shield of the resonator is filled with one or two atmospheres pressure of an electrically insulating gas (e.g., sulfur hexafluoride). This gas is also useful for transferring the heat, developed in the shielded cavity walls and in insulator 42, to the coils. The coils are cooled by water flow provided through ground connection 44. In an alternative embodiment, a vacuum exists on both sides of insulator 42. In this embodiment, power dissipated in insulator 42 is removed by thermal conduction to flange 13.

Figure 2:
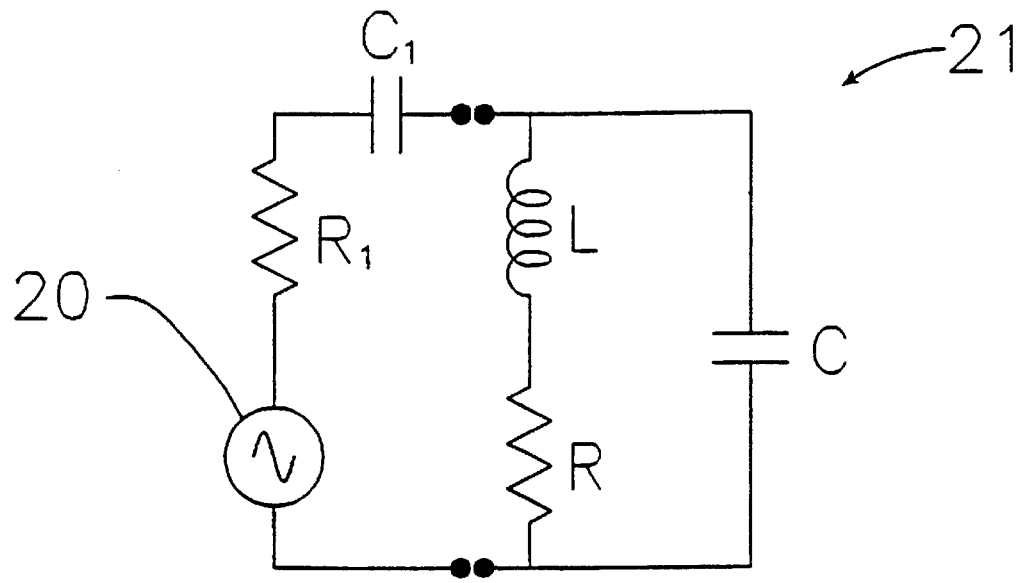
FIG. 2 is a schematic circuit diagram representative of the apparatus of FIG. 1 capacitively coupled to an rf power supply.

As shown in FIG. 2, the resonator is represented by an RLC electrical circuit 21 that has an inductance (L), a capacitance (C), and a loss resistance (R). The inductive component (L) of the resonator is determined from the pair of oppositely wound helical coils 2, 4 that are electrically connected between electrode stem 10 and the inner electrically conducting wall (6) of coil shield 5. The electrical capacitance (C) is determined by the electric field associated with and emanating from coils 2, 4, active electrode 8, and electrode stem 10. The resistance (R) is mainly attributed to the ohmic losses associated with electric currents flowing in the surfaces of the electrical conductors (particularly the coil), power for accelerating the ions, and dielectric heating in insulator materials (e.g., the active electrode and coil support bushing 42). $R_1$ and $C_1$ are respectively the resistance and the capacitance associated with an rf power supply 20 that is capacitively coupled to the resonator.

The electrical behavior and the resonance properties of RLC circuit 21 are described by R. J. Smith in "Circuits, Devices, & Systems" (John Wiley & Sons, New York, 4th edition, p. 181), which is herein incorporated by reference. Resonator 3 has a resonant frequency of $$f = \frac{1}{2\pi \sqrt{LC}}, \qquad (1)$$

which is typically selected to be equal to the commonly used industrial frequency of 13.56 MHz, but can be in the range of 5–50 MHz for accelerating ions in a commercially viable ion implantation system. The resonator has a quality factor Q given by $$Q = \frac{2\pi f L}{R} = \frac{1}{2\pi f C R} = \frac{1}{R}\sqrt{\frac{L}{C}}. \quad (2)$$

This quality factor is a measure of the ratio of the average stored electromagnetic energy to the power dissipated in one rf cycle. Resonator 3 of FIG. 1 achieves a very high Q at a given resonant frequency by minimizing ohmic losses in the coil and in the coil shield.

Figure 2A:
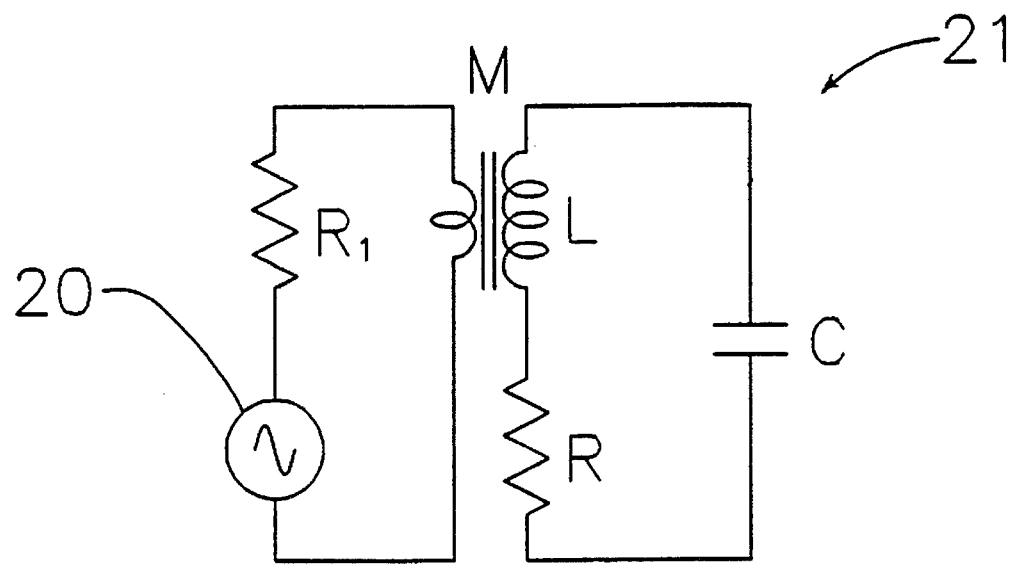
FIG. 2a is a schematic circuit diagram representative of the apparatus of FIG. 1 inductively coupled to an rf power supply.

Referring to FIGS. 1 and 2, the resonator can be energized at a selected resonant frequency by capacitively coupling an rf power supply 20 to the resonator via a capacitor plate 18 having a coupling capacitance $C_1$, Referring to FIGS. 1 and 2a, in an alternative embodiment, power is inductively coupled by a current carrying loop 22 (shown by dashed lines) that has a mutual coupling (M) to the coils 2, 4. For the case of capacitive coupling, optimum power transfer is achieved by selecting the area or by adjusting the position of capacitor plate 18 relative to the coils to generate an input impedance for the resonator that matches the output impedance $R_1$ of the rf power source (typically 50 ohms). The optimum coupling condition is given by $$C_1 = C\sqrt{\frac{R}{R_1}}. \quad (3)$$

For the case of inductive coupling, the optimum power transfer is achieved by selecting the area or by adjusting position of loop 22 such that $$M = \frac{L}{Q}\sqrt{\frac{R_1}{R}}. \quad (4)$$

The resonator is kept in tune at the resonant frequency (e.g., to compensate for dimensional changes induced by temperature variations and long term settling) by adjusting the position (indicated by double-headed arrow 40) of a tuning capacitor plate 38.

According to an important aspect of the invention, the oppositely wound helical coils 2, 4 are formed into a generally toroidal shape that has a generally circular inner boundary region 32 and a generally circular outer boundary region 34 in the plane of the toroidal surface. The coils are energized in parallel such that their internal magnetic fields 26 are reinforcing. The magnetic field is also almost entirely contained within the inner toroidal domain of the coil windings, as shown. This has a great advantage over a single open-ended coil resonator such as that shown in FIG. 3, in which there is a significant return magnetic flux 30 external to the coil 31 that induces high electric currents 35 and corresponding high ohmic power losses in the shield walls 36. In an open-ended coil resonator, shield currents may be comparable or even higher than the coil current. But in the closed toroidal coil structure of the present invention shield currents are negligible relative to the current flowing in the coils.

The generally toroidal form of the coils 2 and 4 shown in FIG. 1 minimizes the magnetic flux leaking outside the outer boundary region 34, particularly as the flux passes through the region between the adjacent ends of each coil. Other geometrical arrangements and multiple coil arrangements that reinforce the internal magnetic flux and minimize the internal flux can be used and will be apparent to those skilled in the art.

Figure 3:
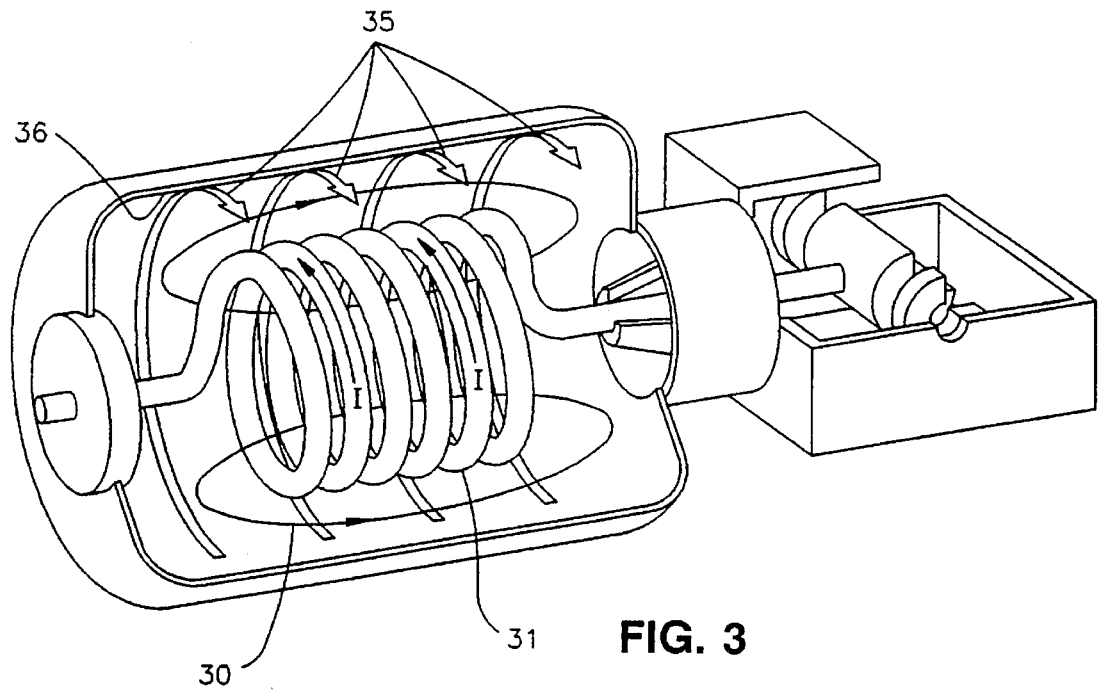
FIG. 3 is a perspective view, in partial cross section, of a resonant system that includes a shielded single, open-faced coil.

In high Q RLC resonators, of the type shown in FIGS. 1 and 3, the ohmic power losses associated with the electric charging current passing through the inductive element is a major portion of the total power loss and is a major contributor to the effective circuit resistance (R; FIGS. 2 and 2a). This current is restricted to flow in the surface region of the coil windings to a small depth approximately equal to the rf skin depth of the surface. The skin depth is inversely proportional to the square root of the product of the frequency, the magnetic permeability and the electrical conductivity of the material (e.g., in copper at 15 MHz the skin depth is about 0.017 mm). Also, as a result of the action of the ac electromagnetic field, the current tends to distribute itself predominantly on the inner surfaces of the coil windings, further reducing the effective surface area available for current flow by approximately 50%.

A very important aspect of the parallel two-coil structure of the present invention, and an advantage over a single coil resonator, is the reduction in ohmic losses associated with the coil current as a result of the two coils sharing the current equally (I/2 in each coil, as shown in FIG. 1). The surface area over which the coil current flows is doubled, yet the winding length need only be increased by approximately 40% to maintain a given shunt inductance at a fixed coil cross-sectional area. More quantitatively, a single coil resonator possessing a coil of length b and turns N has a self-inductance (L') of:

$$L' = k\frac{\mu_0 N^2 A}{b} \quad (0 < k < 1), \quad (5)$$

where k is a geometrical factor which accounts for the reduction in inductance due to the coil being open ended and of finite length, A is the cross-sectional area of a single open-faced coil, and $\mu_0$ is the magnetic permeability ($\mu_0 = 4\pi \times 10^{-7}$ in MKS units) within the shielded cavity. If r' is the resistance of a single open-faced coil, then for a peak charging current I, the power loss is:

$$P' = \frac{1}{2}I^2 r' \quad (6)$$

For the two coil structure of the invention, we note that the magnetic flux passing through the internal toroidal region of the coils is:

$$\phi = \frac{\mu_0 n I A}{2b}, \quad (7)$$

where n is the number of turns for each coil, and the factor of 2 in the denominator accounts for the sharing of the charging current by the two coils. The induced emf generated by each coil is:

$$e = -n\frac{d\phi}{dt} = -\left(\frac{\mu_0 n^2 A}{2b}\right)\frac{dI}{dt}. \quad (8)$$

It follows that the self inductance (L) for the two-coil structure is:

$$L = \frac{\mu_0 n^2 A}{2b} \quad (9)$$

and the total ohmic power loss (P) for both coils, each of resistance r and each carrying a current I/2, is:

$$P = 2\left[\frac{1}{2}\left(\frac{I}{2}\right)^2 r\right] = \frac{1}{4}I^2 r. \quad (10)$$

In order to maintain the inductance value, i e , L=L', the number of turns on each coil of the two-coil structure must be increased over the turns required in a single coil structure of the same cross-sectional area according to $n = N\sqrt{2k}$. The ohmic resistance r for the two-coil resonator is thus related to the single coil resistance r' by:

$$r = r' \frac{n}{N} = r' \sqrt{2k} \quad . \tag{11}$$

Consequently, $$P = P' \sqrt{\frac{k}{2}} \quad . \tag{12}$$

Since k<1, the power losses in resonator 3 is less than 71% of the power dissipation of a comparable single open-faced coil structure.

Figure 4:
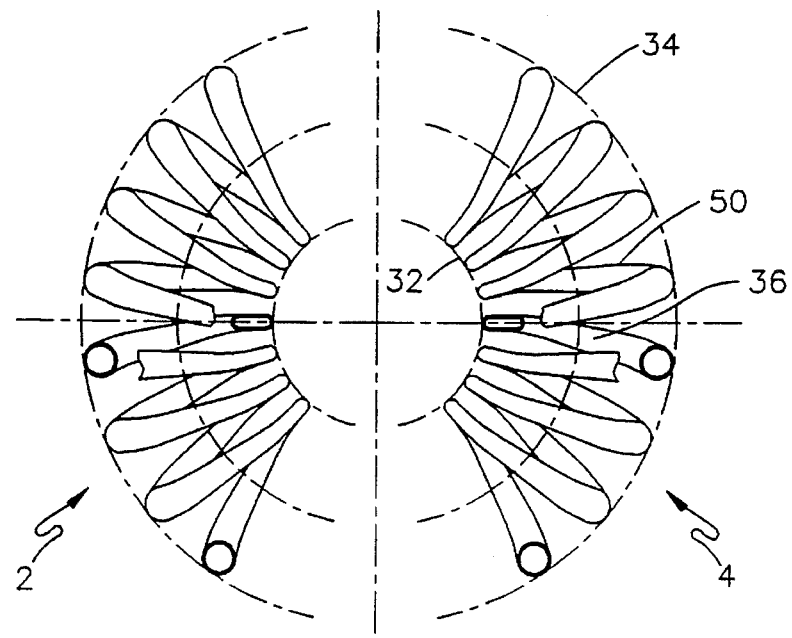
FIG. 4 is an enlarged side view of a coil structure.

Referring to FIG. 4, in a preferred embodiment, the size and the shape of the conductor used in the coil winding are selected to be at or near an optimum value for minimizing the ohmic losses. For a winding conductor that has a circular cross-section of a diameter d, the rf resistance (r) of a coil of n turns, a length b, and a diameter D is:

$$r = \frac{n}{d} \sqrt{\frac{\pi f \mu_0}{\sigma}} \left[ 1 + 2.57 \left( \frac{dn}{b} \right)^2 \left( \frac{D}{b} \right)^{-0.283} \right], \tag{13}$$

where $\sigma$ is the electrical conductivity of the coil material ($\sigma = 5.84 \times 10^7$ for oxygen free copper). The main factor is the ac resistance of the coil resulting from the skin effect. The factor in brackets takes account of the proximity effect and is determined from data given by Terman in "Radio Engineers Handbook" (McGraw-Hill Book Co., Inc., New York, (1943) 192), which is herein incorporated by reference. In terms of n, b, and D, the optimum value for d that minimizes the rf resistance of the inductive element (r) is:

$$d = 0.6238 \frac{b}{n} \left( \frac{D}{b} \right)^{0.142} \tag{14}$$

The quantity b/n appearing in the above expression represents the winding pitch. For a coil with a straight axis, this is uniquely defined. However, for a toroidal form, the pitch is less on the inside than on the outside of the torus. In a presently preferred embodiment, the windings 50 of coils 2, 4 are mechanically pressed after the coil has been wound to make generally a wedge shape 36, as shown in FIG. 4. Thus, the windings of the coils in resonator 3 are respectively formed so that the ratio of the inter-turn spacing to the circumference at the inner boundary region 32 of the toroidal surface is substantially the same as the corresponding ratio at the outer boundary region 34 of the toroidal surface.

Figure 5:
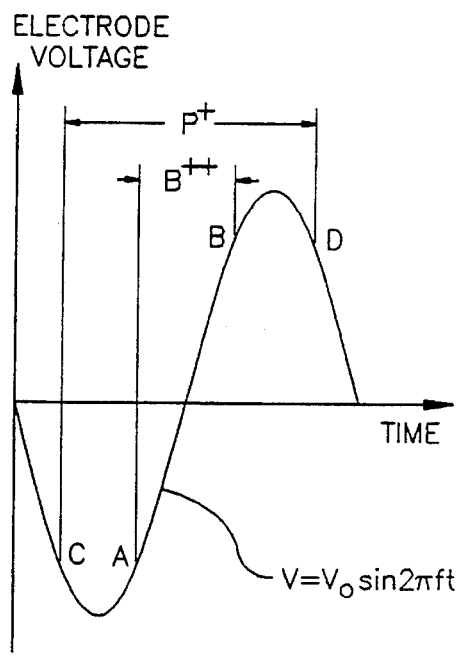
FIG. 5 is a plot of active electrode voltage as a function of time.
Figure 6:
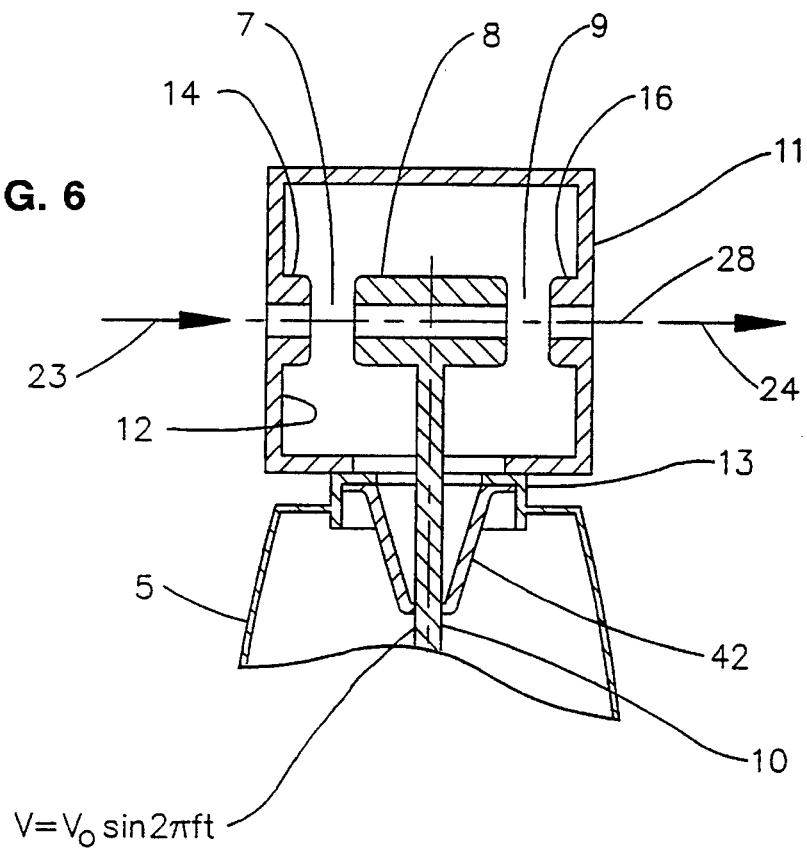
FIG. 6 is an enlarged diagrammatic cross sectional side view of the electrodes in the accelerator of FIG. 1.

Referring to FIG. 5, when the resonator of FIG. 1 is energized, the voltage (V) of the active electrode 8 varies sinusoidally with time ($V = V_0 \sin(2\pi f t)$) with respect to the ground electrodes 14, 16. The amplitude ($V_0$) is typically between 10–200 kV. As a consequence, a strong alternating electric field is generated in the two gaps 7, 9 between the active electrode 8 and the ground electrodes 14, 16, as shown in FIG. 6.

Figure 7:
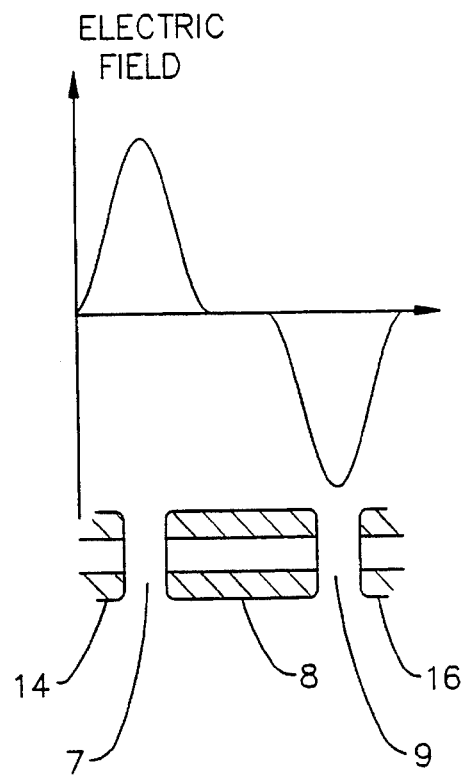
FIG. 7 is a plot of electric field distribution along the beam path defined through the electrodes of FIG. 1.

At an instant in time, the electric field distribution along the ion beam path 28 through the electrode housing 11 is typically as shown in FIG. 7. As ions travel along beam path 28 (defined by the holes of typically 20–25 mm diameter in the three spaced apart electrodes 14, 8, 16) they are successively accelerated in each of the two gaps if the radio-frequency (rf) phase advances by approximately 180 degrees in the same time it takes the ions to travel from the first gap 7 to the second gap 9 and if the ion enters the first gap 7 at the appropriate rf phase angle. For example, if positively charged ions pass through the first gap 7 when the potential on the active electrode is negative relative to ground potential, they are accelerated or, "pulled" from the , region of the ground electrode 14 towards the active electrode 8. If the ions arrive at the second gap 9 after the rf phase has advanced by 180 degrees, the potential of the active electrode has now reversed polarity and has now become negative, and the ions are again accelerated, or "pushed," by the active electrode 8 towards the ground electrode 16.

By appropriate selection of the length of the active electrode 8 and the resonant frequency (f), light or heavy ions and fast or slow ions are efficiently accelerated, as shown schematically in FIG. 5 for $B^{++}$ (boron, doubly charged) ions and $P^+$ (phosphorus, singly charged) ions possessing the same initial energy per charge state. The $B^{++}$ ions have a relatively high charge-to-mass ratio of 0.18, and thus move relatively fast and spend less time passing through the region of active electrode 8. The $B^{++}$ ions experience acceleration as a consequence of the electrode voltage changing from point A to point B. The $P^+$ ions, on the other hand, have a much lower charge-to-mass ratio of 0.032, and thus moves relatively slowly and take more time to pass through the region of active electrode 8. Nevertheless, the $P^+$ ion still experiences acceleration because during the transit time the electrode voltage changes from point C to point D. In fact, the two ions receive almost the same acceleration, corresponding to approximately 70% of the peak acceleration available.

Figure 8B:
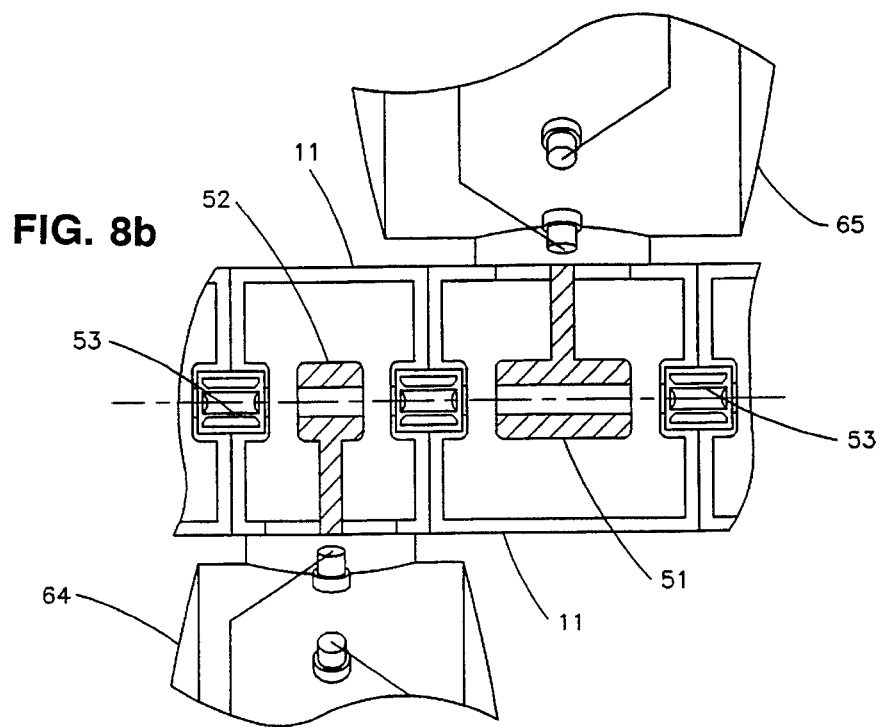
Figure 8:
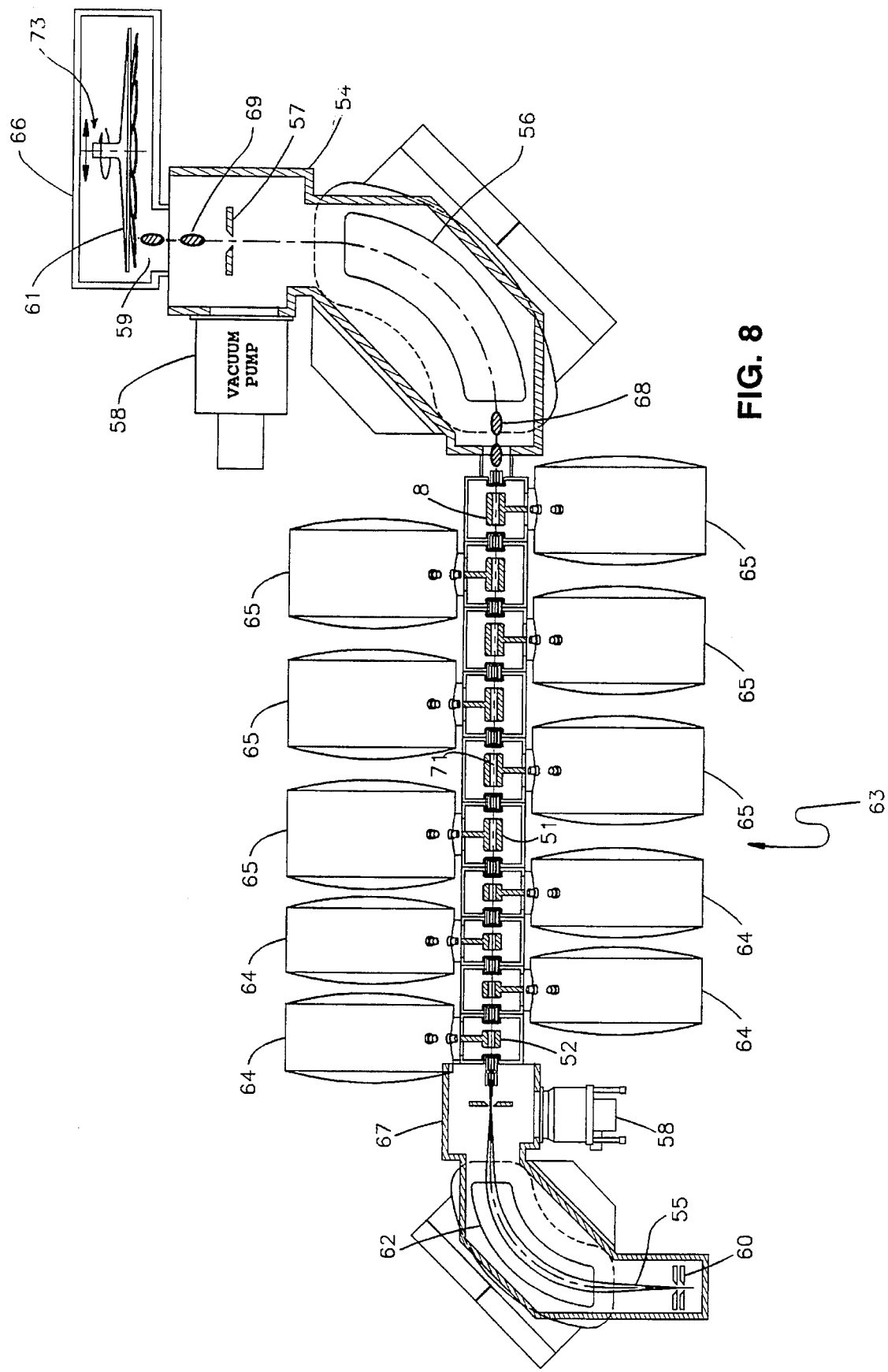
FIG. 8 is a diagrammatic top view of an ion implantation system including resonators of the type shown in FIG. 1.

Referring to FIG. 8, an ion implantation system 63 incorporates a sequence of acceleration stages 64 and 65 of the type shown in FIG. 1. The active electrodes are longer (51) in the later accelerator stages 65 than those (52) in the earlier accelerator stages 64 at the beginning of the accelerator in order to keep the ion transit times through the active electrode near one half an rf period as the ion velocity increases from the beginning to the end of the accelerator. The system includes a pre-accelerator vacuum housing 67 that contains an ion source 60 and an analyzer magnet 62 for purifying the ion species in the beam 55 emerging from the ion source. After the analyzer magnet, the ion beam passes through the sequence of accelerator stages 64 and 65 and then into a post-accelerator housing 54 that contains a second analyzer magnet 56 and a resolving slit 57 adjusted to respectively set the final ion energy and energy spread of the beam 69 entering an end station 66. A wafer support 61 and a mechanical system in the end station mechanically passes wafers 59 through the ion beam 69, in a manner (73) to achieve uniform irradiance over the wafer (e.g., by rotation and lateral translation). The entire ion implantation system is maintained under vacuum by vacuum pumps 58.

As described in Glavish et al. (U.S. Pat. No. 4,667,111), a succession of independent accelerator stages as shown in FIG. 8 can synchronously accelerate ions from a low injection energy of typically 80–100 keV per charge state to a much higher energy of typically 1 MeV per charge state. The accelerator stages operate synchronously at the same frequency (or at a harmonic of this frequency), with the active electrodes of each stage energized with an appropriate phase and amplitude depending on the selected operating frequency, the length, spacing and aperture of the electrodes, the initial ion energy, the final desired ion energy, and the charge-to-mass ratio of the ions species to be implanted, as well as other factors relating to the dynamics experienced by the ions as they are accelerated.

Figure 8A:
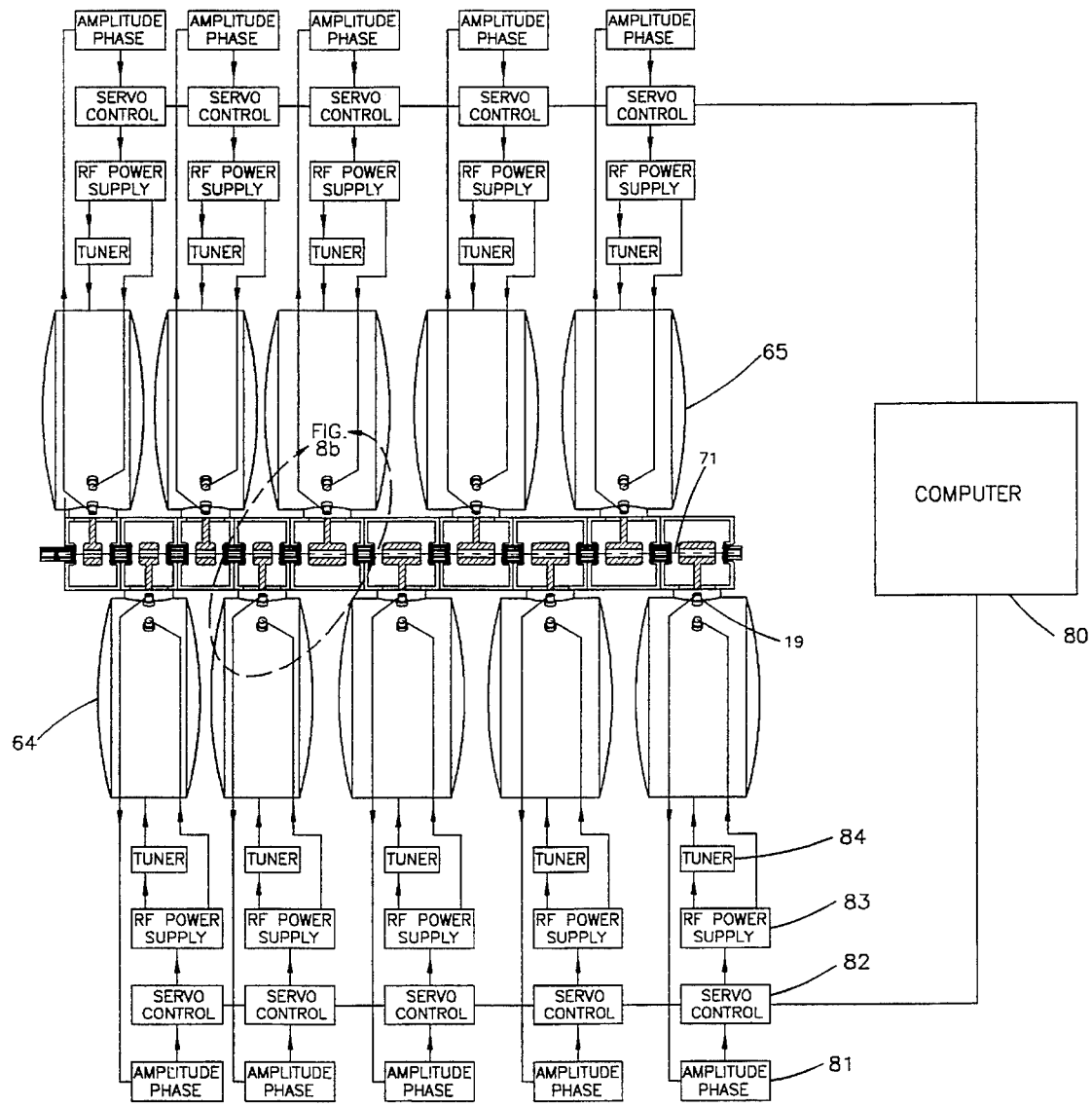
FIG. 8a is a diagrammatic view of successive accelerator stages in the ion implantation system of FIG. 8.

Referring to FIG. 8a, the phase and amplitude in each stage is electronically monitored (81) using one or two capacitive pick-up probes 19 (see FIG. 1). A servo control system 82, controlled by a master computer 80 that compares the measured amplitudes and phases with reference values, adjusts the rf power supplies 83 and cavity tuners 84 of each cavity to maintain a prescribed ion velocity profile along the beam path along the accelerator axis 71.

The ions leave the accelerator as a continuous stream of packets 68 (FIG. 8) or bunches, one bunch emerging every fundamental rf period. The formation of such bunches is well known to those skilled in the art of rf linear acceleration (e.g., see A. D. Vlasov, "Theory of Linear Accelerators," Israel Program for Scientific Translations, Jerusalem, 1968, which is herein incorporated by reference). Bunching is a consequence of the longitudinal focusing that is generated by the time-varying rf electric fields in the region of the active electrodes for certain ranges of the rf phase. The phase of the first accelerator stage (and sometimes the second and third stages) is usually selected to enhance the bunching action at the beginning of the accelerator in order to capture a high fraction (e.g., 30–50%) of the injected ions. Generally, the forces that produce bunching also cause radial defocusing of the beam. To compensate for this radial defocusing, devices such as electrostatic quadrupoles 53 are located along the beam path as shown in FIG. 8b and their action prevents the beam from expanding transversely and from becoming lost to the surfaces of the accelerator electrodes.

To obtain high energy acceleration in practical dimensions, it is necessary to have a physically compact accelerator stage, as well as the capability to generate high electrode voltages with minimal power dissipation. An important aspect of the invention is that the plane of the toroidal coil is perpendicular to the ion beam axis 28 (FIG. 1). This reduces the axial length of the accelerator stage, which in turn reduces the length of an accelerator made up of multiple stages. Moreover, as shown in FIG. 1, the coil and shield projects out to one side of the electrode housing 11, which enables successive stages 64 and 65 in the accelerator to be staggered either side or azimuthally around the accelerator axis 71, as shown in FIG. 8.

The table of FIG. 9 summarizes the operating parameters suitable for a typical accelerator stage in a presently preferred high energy ion implanter. A power dissipation of 2600 W is required to generate an electrode voltage of 95 kV. By comparison, to achieve the same electrode voltage of 95 kV for a resonator with a single open-faced coil with the same shield length of 370 mm, a power in excess of 4000 W is required.

Other embodiments are within the scope of the claims.

Figure 10:
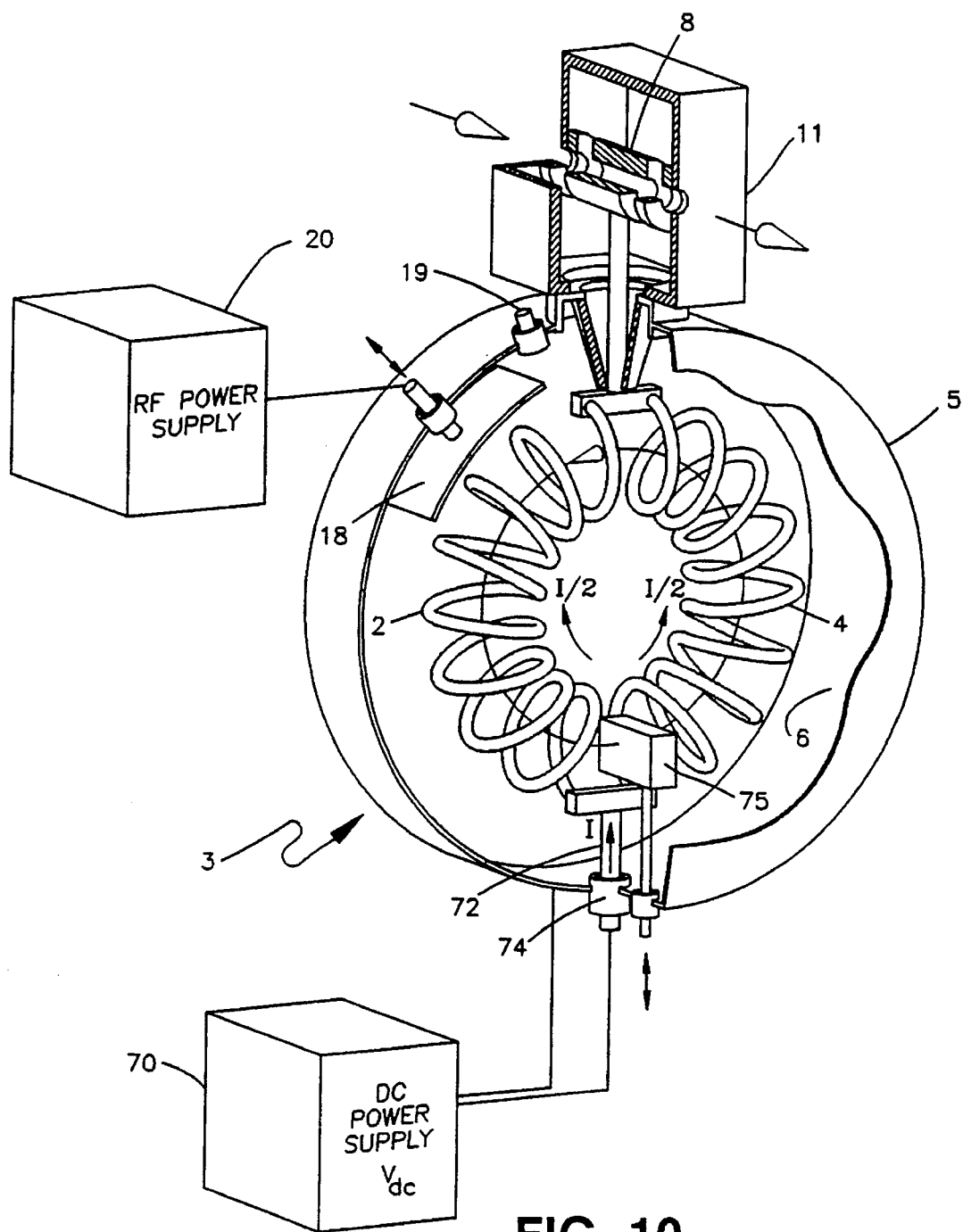
FIG. 10 is a perspective view, in partial cross section, of an alternative apparatus for accelerating ions.

Referring to FIG. 10, an alternative resonator includes coils 2, 4 that are isolated from the coil shield 5, instead of being grounded at one end, as in the resonator of FIG. 1. A stem 72 passes through an insulated bushing 74 in the coil shield 5 with a capacitance $C_g$ defined therebetween. This isolation enables, e.g., a dc voltage ($V_{dc}$) from a power supply 70 to be applied to the coils and hence to active electrode 8. Because the return rf currents from the shield must pass through the capacitance $C_g$ to reach the coil stem 72, the effective coil inductance ($L_e$) at the resonance frequency (f) is reduced from the actual coil inductance (L) according to $$L_e = L \left( 1 - \frac{1}{4\pi^2 f^2 C_g L} \right). \tag{15}$$

Thus, to maintain the resonant frequency, more turns are required, thereby increasing the power dissipation.

As shown in FIG. 10, low loss ferrite material 75 that has a relative magnetic permeability that is greater than unity, is moved in or out of the toroidal region of the coils to increase or decrease the circuit inductance. This is an alternative scheme for tuning the resonator to a selected frequency. If large amounts of ferrite material are located within the coil, less coil turns are required to maintain a given resonant frequency, and hence a lower ohmic power dissipation results. This is advantageous provided the dissipated power in the ferrite can be removed by gas or liquid cooling and is less than the reduction in the power dissipated in the coil.

Figure 11:
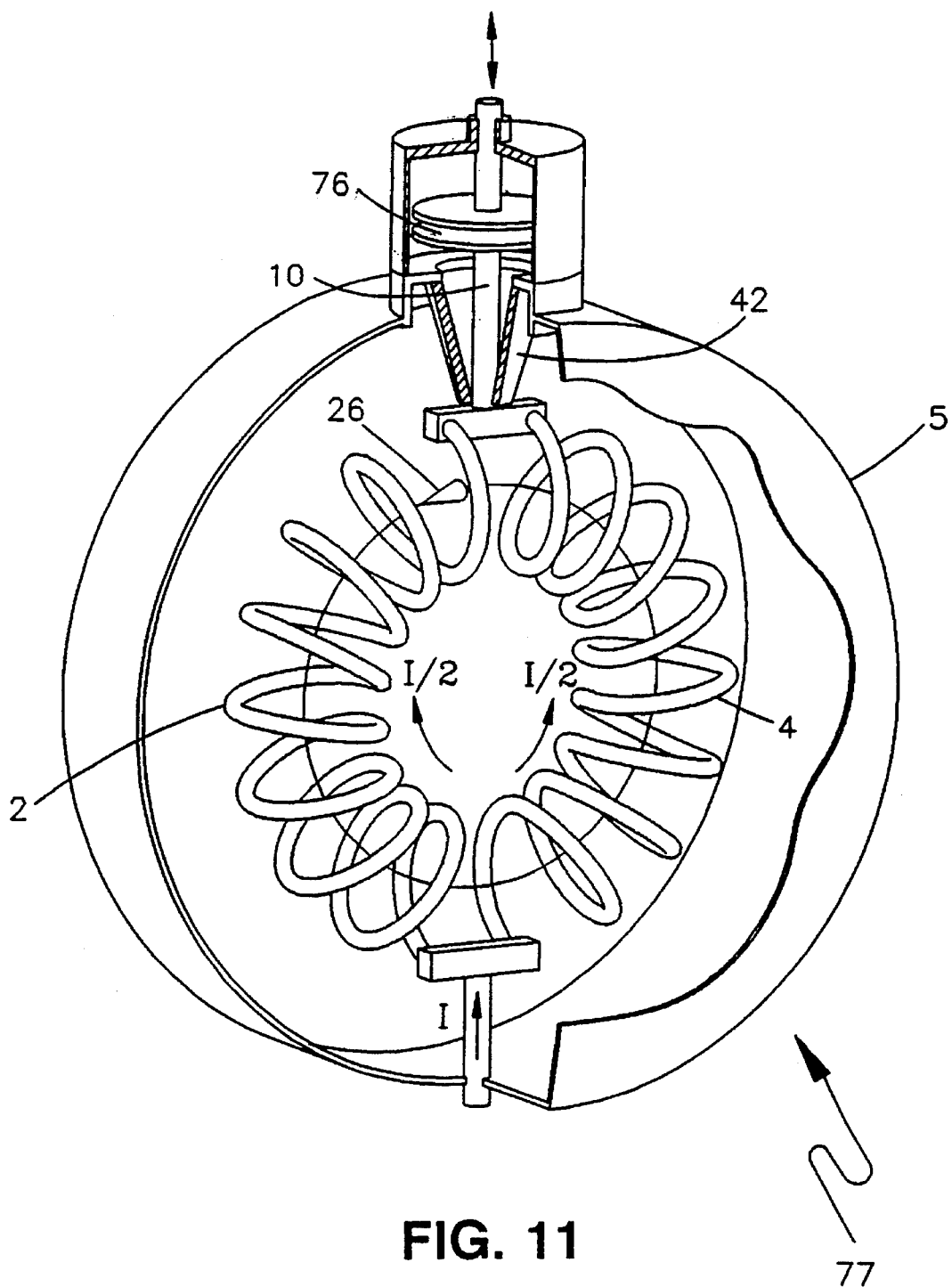
FIG. 11 is a perspective view, in partial cross section, of a tunable resonant system.

Referring to FIG. 11, a high Q resonant system 77 for use as a universal RLC circuit includes the basic coil structure of the resonator 3 of FIG. 1. Such a system is particularly useful in general rf circuit applications where it is important to minimize ohmic power losses—e.g., in high Q tuned amplifiers, in oscillators, in impedance transformers, and in coupling networks. Such a resonator enables selection of a wide range (e.g, ±20%) of resonant frequencies by adjustment of a tuning capacitor 76.

Still other embodiments are within the scope of the claims.

What is claimed is:

1. An apparatus for accelerating atomic and molecular ions comprising an ion input for receiving ions traveling along a beam path, an ion output positioned along the beam path to output accelerated ions, an electrically conductive shield, a pair of oppositely wound coils disposed within the shield, the coils, being in parallel, have respective terminating ends electrically coupled together in pairs, the end regions of the two coils being positioned relative to each other for flow of flux between the coils so that, when the coils are energized, magnetic fields produced by the coils are reinforced within the coils and are reduced outside of the coils, and a plurality of spaced apart electrodes that are positioned between the ion input and the ion output and that include at least one active electrode that is electrically coupled to the coils, wherein, when the coils are energized, the coils produce at the active electrode a time-varying oscillatory electric potential of a selected resonant frequency to establish between electrodes a time-varying oscillatory electric field in the vicinity of the beam path to accelerate the ions received by the ion input.

2. An apparatus for implanting atomic and molecular ions into a workpiece comprising:

an ion source for directing ions along a beam path;

an ion accelerator comprising at least one resonant accelerator stage comprising an ion input for receiving ions from the ion source traveling along the beam path, an ion output positioned along the beam path to output accelerated ions, an electrically conductive shield, a pair of oppositely wound coils disposed within the shield, the coils, being in parallel, have respective terminating ends electrically coupled together in pairs, the end regions of the two coils being positioned relative to each other for flow of flux between the coils so that, when the coils are energized, magnetic fields produced by the coils are reinforced within the coils and are reduced outside of the coils, and a plurality of spaced apart electrodes that are positioned between the ion input and the ion output and that include at least one active electrode that is electrically coupled to the coils, wherein, when the coils are energized, the coils produce at the active electrode a time-varying oscillatory electric potential of a selected resonant frequency to establish between electrodes a time-varying oscillatory electric field in the vicinity of the beam path to accelerate the ions received by the ion input; and a support for positioning the workpiece so that accelerated ions from the output of the ion accelerator impact the surface of the workpiece and become implanted therein.

3. The apparatus of claim 1 or 2 wherein the end regions of the oppositely wound coils are generally aligned with each other to mutually provide respective magnetic paths for return flux generated by the coils.

4. The apparatus of claim 3 wherein the oppositely wound coils define a substantially continuous, substantially unidirectional path for magnetic flux generated by the coils.

5. The apparatus of claim 1 or 2 wherein the oppositely wound coils are constructed and arranged so that magnetic fields generated by the coils are substantially confined within a domain defined by the windings of the coils.

6. The apparatus of claim 1 or 2 wherein the oppositely wound coils define a generally toroidal surface having a generally circular inner boundary region and a generally circular outer boundary region.

7. The apparatus of claim 6 wherein the coils are respectively formed so that the ratio of the inter-turn spacing to the circumference at the inner boundary region of the toroidal surface is substantially the same as the corresponding ratio at the outer boundary region of the toroidal surface.

8. The apparatus of claim 1 or 2 wherein the oppositely wound coils define a generally toroidal surface and wherein the toroidal surface lies in a plane substantially perpendicular to the beam path of the ions.

9. The apparatus of claim 1 or 2 wherein the input is coupled to the conductive shield and the output is electrically insulated from the conductive walls of the shield.

10. The apparatus of claim 1 or 2 wherein three coaxially aligned electrodes define an acceleration path, wherein one of the three electrodes is an active electrode that is coupled to the resonator and is positioned in the ion beam path between the other two of the three electrodes, which are coupled to ground potential, the other two electrodes being respectively spaced apart from the active electrode to respectively define first and second accelerating gaps therebetween.

11. The apparatus of claim 2 further comprising a plurality of the resonant accelerator stages respectively coupled to different respective active electrodes, between which are disposed electrodes coupled to ground potential, wherein the accelerator stages have respective resonant frequencies that are adjustable in phase and amplitude to tune the alternate active electrodes for accelerating a selected ion species, and wherein, when energized by the accelerator stages, the active electrodes create a time-varying electric field to accelerate ions successively through a plurality of accelerating gaps defined between active and grounded electrodes.

12. The apparatus of claim 11 wherein the time-varying fields produced by the resonant accelerator stages at the active electrodes are characterized by peak amplitudes between 10 kV and 200 kV and frequencies between 5 MHz and 50 MHz.

13. A method for implanting ions into a workpiece comprising the steps of:

providing a beam of ions traveling along a beam path;

accelerating the ions in the beam by creating, in the vicinity of the ion beam path, a time-varying oscillatory electric field of a selected frequency in the rf frequency range and of an amplitude selected to accelerate the ions, the oscillatory electric field being produced by energizing a pair of oppositely wound coils that are coupled to an active electrode in the vicinity of the ion beam path and being in parallel, having respective terminating ends electrically coupled together in pairs, the end regions of the two coils being positioned relative to each other for flow of flux between the coils so that, when the coils are energized, magnetic fields produced by the coils are reinforced within the coils and are reduced outside of the coils wherein, when the coils are energized, the coils produce at the active electrode a time-varying oscillatory electric potential of a selected resonant frequency to establish between electrodes a time-varying oscillatory electric field in the vicinity of the beam path to accelerate the ions; and implanting the ions into the workpiece by directing the accelerated ions along a path that intersects a surface region of the workpiece.

14. The method of claim 13 further comprising the steps of accelerating the ions through a plurality of successive spaced apart acceleration stages, and coordinating the phase of the time-varying electric field between the acceleration stages based upon the charge-to-mass ratio of the ions to achieve a desired energy for the implanted ions.

15. A resonant system for producing a time-varying electric potential of a selected resonant frequency comprising an electrically conductive shield, an output terminal, and a pair of oppositely wound coils disposed within the shield, the coils being in parallel, having respective terminating ends electrically coupled together in pairs, the end regions of the two coils being positioned relative to each other for flow of flux between the coils so that, when the coils are energized, magnetic fields produced by the coils are reinforced within the coils and are reduced outside of the coils, and a plurality of spaced apart electrodes that are positioned between the ion input and the ion output and that include at least one active electrode that is electrically coupled to the coils, wherein, when the coils are energized, the coils produce at the active electrode a time-varying oscillatory electric potential of a selected resonant frequency to establish between electrodes a time-varying oscillatory electric field in the vicinity of the beam path to accelerate the ions received by the ion input.

16. The resonant system of claim 15 wherein the oppositely wound coils define a generally toroidal surface having a generally circular inner boundary region and a generally circular outer boundary region.

17. The apparatus of claim 15 wherein the coils are respectively formed so that the ratio of the inter-turn spacing to the circumference at the inner boundary region of the toroidal surface is substantially the same as the corresponding ratio at the outer boundary region of the toroidal surface.

18. The resonant system of claim 15 wherein the coils are formed from elongated conductive material having a thickness dimension selected to substantially reduce the rf resistance of the coils.

19. The resonant system of claim 15 further comprising a movable conductive surface for adjusting the resonant frequency of the supplied time-varying electric potential.

* * * * *